United States Patent [19]

Prince

[11] Patent Number: 4,476,568
[45] Date of Patent: Oct. 9, 1984

[54] CHARGE COUPLED DEVICE SUBTRACTOR

[75] Inventor: Paul R. Prince, Fountain Valley, Calif.

[73] Assignee: Hughes Aircraft Company, El Segundo, Calif.

[21] Appl. No.: 223,966

[22] Filed: Jan. 12, 1981

Related U.S. Application Data

[63] Continuation of Ser. No. 146,997, May 6, 1980, abandoned, which is a continuation of Ser. No. 910,034, May 26, 1978, abandoned, which is a continuation of Ser. No. 723,356, Sep. 15, 1976, abandoned.

[51] Int. Cl.³ .................... G11C 19/28; H01L 29/78
[52] U.S. Cl. ................................. 377/60; 357/24
[58] Field of Search ................... 357/24; 377/57-63

[56] References Cited

U.S. PATENT DOCUMENTS

| 3,623,132 | 11/1971 | Green ................................. 357/24 |
| 3,801,883 | 4/1974 | Tiemann .............................. 357/24 |
| 3,999,152 | 12/1976 | Sato et al. ........................... 357/24 |
| 4,034,199 | 7/1977 | Lampe et al. ....................... 357/24 |
| 4,123,733 | 10/1978 | Poierier .............................. 357/24 |

OTHER PUBLICATIONS

Engeler et al., "The Surface-Charge Transistor", IEEE Trans. Electron Devices, vol. ED-18, (12/78), pp. 1125-1136.
Melen et al., "One-Phase CCD: A New Approach to Charge Coupled Device Clocking", IEEE J. Solid-State Circuits, vol. SC-7, (2/72), pp. 92-93.
Sequin et al., Charge Transfer Devices, Academic Press, N.Y., (1975), pp. 18-21, 38, 39, 47-53, 70-73, 98-101, 218, 219.
MacLennan, "Charge-Coupled Devices-Signal Processing", Wireless World, (2/75), pp. 61-65.

Primary Examiner—Gene M. Munson
Attorney, Agent, or Firm—Lewis B. Sternfels; A. W. Karambelas

[57] ABSTRACT

A non-destructive charge subtraction output system for charge coupled devices (CCD) in which a floating electrode is clamped in the presence of a first charge so that when the first charge leaves the potential well and a second charge enters, the signal sensed is representative of the difference between the first and second charges with excellent common mode rejection, high bandwidth, and low power. The system operates so as to either provide a difference of adjacent charges along a channel either with or without an isolating bit or bits or to provide subtraction of the charges selected along a sequence of charges passing through the CCD channel. One use of the system in accordance with the invention is to sense moving targets in a scene having a substantially fixed or non-moving background.

11 Claims, 16 Drawing Figures

Where $Q_{nA}$ = Signal A
$Q_{nI}$ = Fixed Isolation-Bit
$Q_{nB}$ = Signal B

CHARGE COUPLED DEVICE SUBTRACTOR

This is a continuation of application Ser. No. 146,997, filed May 6, 1980, now abandoned, which is a continuation of application Ser. No. 910,034, filed May 26, 1978, now abandoned, which is a continuation of Ser. No. 723,356 filed Sept. 15, 1976, now abandoned.

BACKGROUND OF THE INVENTION

1. Field of the Invention

This invention relates to signal subtraction or moving target indication and particularly to a signal subtraction system utilizing charge coupled devices that substantially eliminates the common mode error, reduces power and provides high bandwidth.

2. Description of the Prior Art

Conventionally, to provide a difference or subtraction output function with charge coupled devices, an operational amplifier and a sample and hold circuit were required. However, the amplifier has typically 60 db common mode error for precision large size and high power operational amplifiers and requires considerable space and heat dissipation. A system utilizing CCD techniques that would provide a difference or subtraction of charges without requiring external circuitry would be a substantial advantage to the art.

SUMMARY OF THE INVENTION

The system of this invention is a CCD structure and clocking system that provides a very low power, small size signal subtract or with very good common mode rejection and without the use of differential amplifiers. The floating electrode utilized as the output device is electrically clamped to a reference voltage and then unclamped when a first charge $Q_{n-1}$ is beneath it in a storage well. After $Q_{n-1}$ is clocked out of this well, a voltage proportional to its value is stored in the nodal capacitance provided by the electrodes and structure and when the subsequent charge $Q_n$ is clocked into the potential well, the voltage is sensed as $(Q_n - Q_{n-1})/C_t$. The system in accordance with the invention allows not only subtraction of adjacent charges along a channel but subtraction of charges separated by an isolation bit or bits and subtraction of selected charges along a stream of charges passing along a CCD channel. Thus, by properly controlling the clocking of the reset clamp on selected CCD clock periods and observing on intermediate periods, selective difference signals may be obtained.

It is therefore an object of this invention to provide a signal subtractor system utilizing charge coupled devices.

It is another object of this invention to provide a charge coupled device floating gate subtractor.

It is a further object of this invention to provide a moving target indication system that compares signal values with excellent common mode rejection.

It is a still further object of this invention to provide a signal subtraction or difference system that does not require differential amplifiers or sample and hold circuits.

It is another object of this invention to provide a CCD signal subtraction system in which selective differences may be obtained.

BRIEF DESCRIPTION OF THE DRAWINGS

These and other objects, features, and advantages of the invention, as well as the invention itself, will become more apparent to those skilled in the art in the light of the following detailed description taken in consideration with the accompanying drawings wherein like reference numerals indicate like or corresponding parts throughout the several views wherein.

DESCRIPTION OF THE PREFERRED EMBODIMENT

Figures 1, 3A:
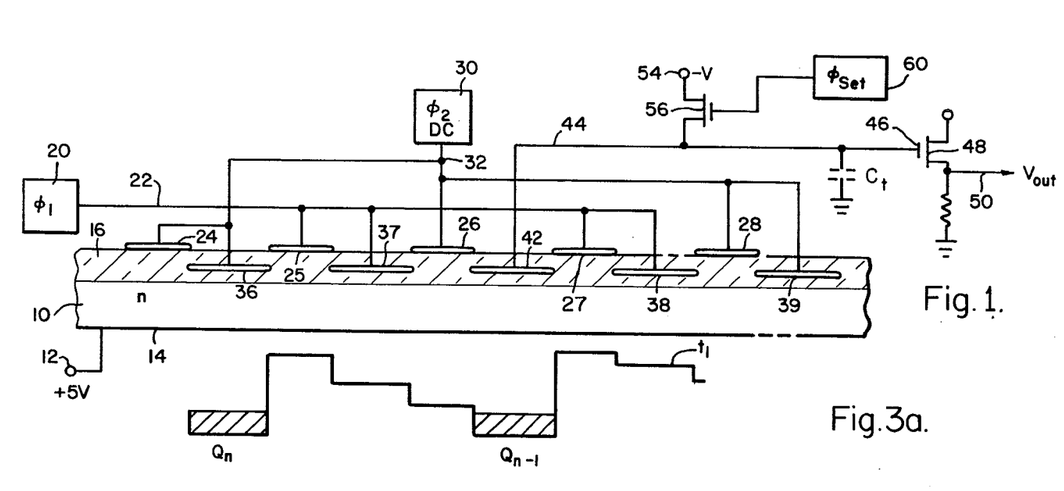
FIG. 1 is a schematic cross-section view of a portion of a p channel CCD showing the signal subtractor in accordance with the invention.
FIGS. 3a to 3c are schematic diagrams showing the potential configuration established in the system of FIG. 1 for three time conditions and showing the movement of the charge packets from well-to-well.
Figure 1A:
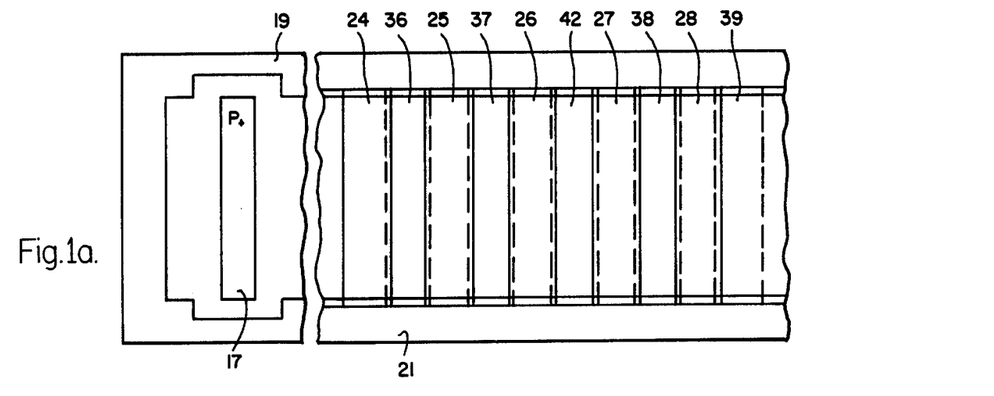
FIG. 1a is a schematic plan view showing the electrodes of the CCD of FIG. 1.

Referring first to FIG. 1, a CCD (charge coupled device) channel is shown in cross-section, it being understood that the electrodes may have a width for example of approximately five times the length of each electrode in the direction along the channel as can be seen in FIG. 1a. A substrate 10, may for example be of an n type semiconductor and the substrate material for illustrative purposes has a +5 reference voltage from a source 12 applied to a conductor plate 14 at the bottom thereof. A thin oxide material 16 is deposited on top of the substrate 10 and includes both buried and surface electrodes through which potentials are applied to move charges from left to right from one potential well to another. It is to be understood that the principles of the invention are equally applicable to any suitable structures and are not limited to the illustrated structure. The charges are entered into the channel by any suitable circuitry at the input to the channel as well known in the art, and a p+ diffusion region is shown in FIG. 1a as the input structure 17 to form a p channel CCD. Suitable n+ channel stops 19 and 21 are provided at the edge of the substrate 10 as shown in FIG. 1a to retain the charges within the channel. The invention is illustrated with a single phase driving system using a four phase structure but it is to be understood that it is equally applicable to other types of suitable driving arrangements that move the charge along the channel. A $\phi_1$ signal from a suitable source 20 is applied through a lead 22 to electrodes such as 25, 37, 27 and 38 and a $\phi_2$ DC signal is applied from a suitable source 30 through a lead 32 to electrodes 24, 36, 26, 28, and 39. A resettable floating electrode 42 which is utilized for read-out is coupled through a lead 44 to a source follower circuit 46 indicated as a PET 48 with the lead 44 coupled to the control electrode and with the other electrodes coupled between suitable sources of potential and current to provide a signal $V_{out}$ to an output lead 50. A clamp voltage $-V$ is applied from a source 54 through a PET 56 to the lead 44 to establish the reference potential and to allow the subtraction circuit to operate. The timing of the PET 56 is controlled from a $\phi_{SET}$ source 60 which clamps the floating electrode 42 in the presence of the first charge of the subtraction process in a well at that position. The capacitance associated with the lead 44 is shown by a dotted capacitor $C_t$ which includes the capacitance of the amplifier and stray capacitances $C_a$, the series capacitance of the oxide $C_{ox}$ and the voltage dependant depletion capacitance $C_d$. It is to be noted that the surface electrodes may in some arrangements be less in width as shown in FIG. 1 such as approximately three-fourths of the width of the buried electrodes.

Figure 2:
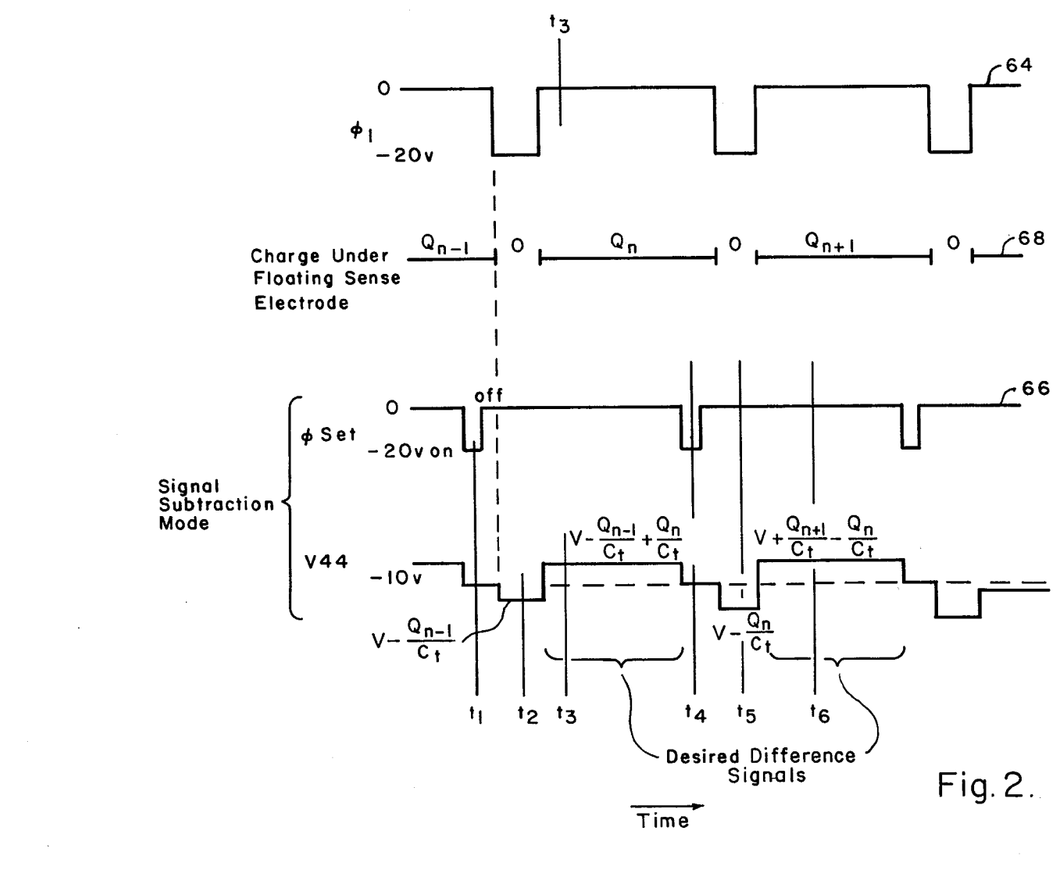
FIG. 2 is a schematic diagram of waveforms of voltage or signal charge as a function of time for explaining the operation of the system of FIG. 1.
Figure 3B:
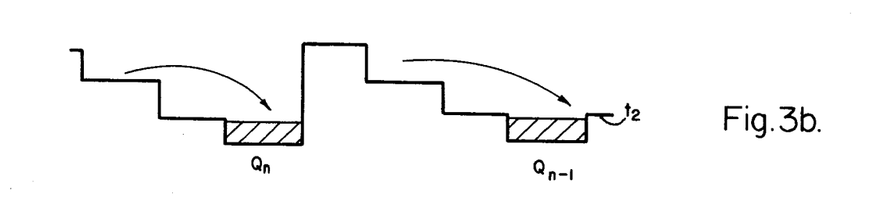

Referring now also to FIG. 2, $\phi_1$ is shown by a waveform 64 and operates in conjunction with $\phi_{SET}$ of a waveform 66 and the $\phi_2$ DC signal to move the charges along the channel. At a time $t_1$ a signal charge $Q_{n-1}$ shown along a line of charges 68 is in the sense well under the electrode 42 as shown in FIG. 3a, and the $\phi_{SET}$ pulse of the waveform 66 is applied to the gate of MOSPET switch 56 to establish the surface potential of the charge $Q_{n-1}$ in addition to establishing the well. When the $\phi_{SET}$ pulse of the waveform 66 returns to its OFF potential prior to the pulse of the waveform 64, the lead 44 is in a floating condition and the capacitance $C_t$ assumes the charge $VC_t$. At a time $t_2$ the $\phi_1$ pulse of the waveform 64 is applied to the surface electrodes 24, 26, and 28 and the charge $Q_{n-1}$ is transferred to a subsequent well as shown in FIG. 3b.

Figure 3C:
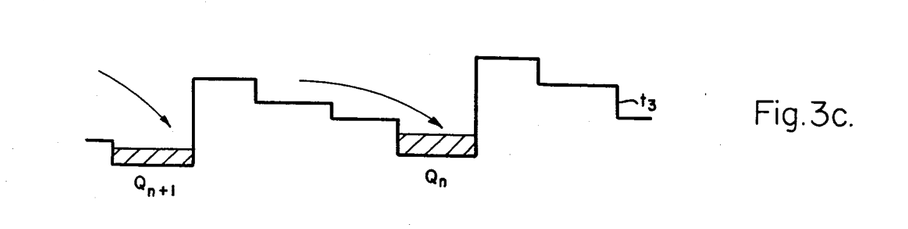

Since the $Q_{n-1}$ charge is transferred from beneath the floating electrode 42, a corresponding charge must be removed from $C_t$ for charge equalization. Thus, at time $t_2$ the voltage on lead 44 indicated as V44 in FIG. 2 is $V-(Q_{n-1})/C_t$. When the $\phi_1$ pulse of the waveform 64 is terminated, charge $Q_n$ is shifted into the well under the electrode 42. At time $t_3$ as shown in FIG. 3c the voltage on the capacitance $C_t$ is therefore $$V - \frac{Q_{n-1}}{C_t} + \frac{Q_n}{C_t},$$

which is a difference signal and may be read out during the bracketed period. Thus, by storing the voltage $-Q_{n-1}/C_t$ of the previous charge in the electrode capacitance, when the charge $Q_n$ enters the well under floating electrode 42 a difference signal is provided with a very small common mode rejection since for $Q_n=Q_{n-1}$ the output is substantially independent of $Q_n$. Similarly, at time $t_4$ with the charge $Q_n$ in the well under the electrode 42, the $\phi_{SET}$ pulse of the waveform 66 is applied to establish the surface potential in the presence of the charge $Q_n$ under electrode 42 and in response thereto a voltage $-(Q_n/C_t)$ is effectively stored in the capacitance $C_t$. In response to $\phi_1$ of the waveform 64 at time $t_5$ the charge $Q_n$ is removed from the well under the electrode 42 and at time $t_6$ the charge $Q_{n+1}/C_t$ is transferred to the well under the electrode 42 with the readout voltage being $$V + \frac{Q_{n+1}}{C_t} - \frac{Q_n}{C_t}.$$

Thus, it can be seen that signal subtraction of adjacent signals is provided with the CCD channel structure and without the requirement of a differential amplifier.

Figure 4A:
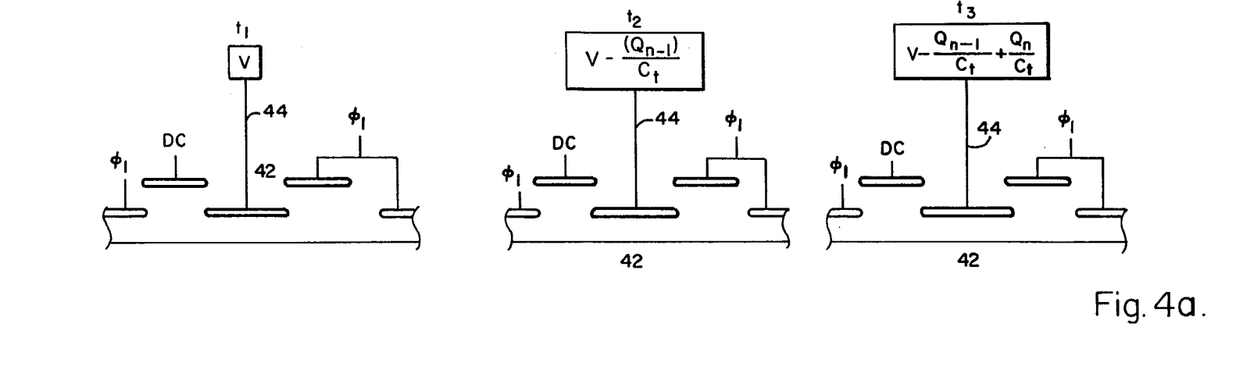
FIG. 4a is a schematic diagram of a portion of a CCD in accordance with the invention for three operating times and FIG. 4b is a schematic diagram showing the surface potential profiles for the three time conditions and the movement of the charge packets from well-to-well.
Figure 4B:
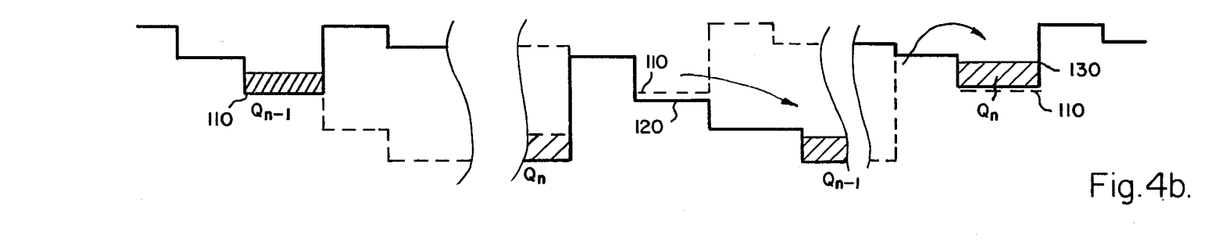

For further explaining the operation, reference is now made to FIGS. 4a and 4b as well as to FIGS. 1 and 2 with a condition at time $t_1$ showing the charge $Q_{n-1}$ in the sense well formed under the electrode 42 with the voltage V from the $\phi_{SET}$ pulse of the waveform 66 establishing the surface potential of the charge. At time $t_2$ the charge $Q_{n-1}$ is removed from beneath the electrode 42 and the voltage $$V - \frac{Q_{n-1}}{C_t}$$

is stored in the capacitance $C_t$ and maintained on the lead 44. At time $t_3$ the next charge $Q_n$ enters the potential well under the electrode 42 and the difference voltage on the lead 44 is $$V - \frac{Q_{n-1}}{C_t} + \frac{Q_n}{C_t}.$$

Figure 5:
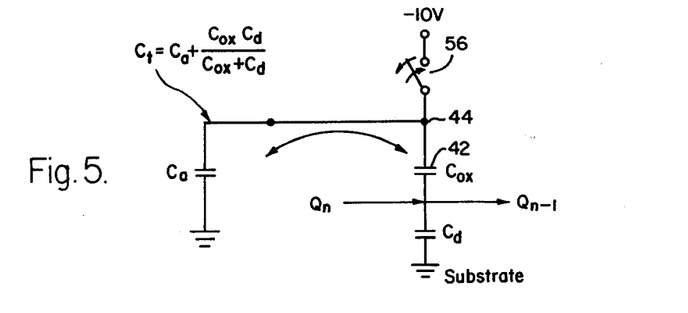
FIG. 5 is a schematic circuit diagram for explaining the capacitances present in the CCD of FIG. 1 and their function during the subtraction process.

The effective bottom of a CCD potential well is defined by the voltage on the electrode. Since the electrode voltage changes on a floating electrode as charge is added or removed from the potential well, the bottom of the well also changes in response thereto. This change of the bottom of the potential well has a small affect on dynamic range because normally the capacitance $C_a$ is relatively large compared to the capacitance $C_d$. The term $C_a$ represents the gate capacitance of the output amplifier or source follower and any other stray capacitance on that node and the term $C_d$ represents the depletion capacitance. In the illustrated example of FIGS. 4a and 4b, the carriers are holes so that at time $t_2$ the bottom of the well 120 is slightly lower than the level 110 at time $t_1$ since the electrode potential itself has changed by $-Q_{n-1}/C_t$. At time $t_3$ since $Q_n$ is assumed to be greater than $Q_{n-1}$ the bottom of the well 130 is slightly above the level 110 at time $t_1$. Referring also to FIG. 5, when the switch 56 is closed, current establishes $-10$ volts on the common node 44 of $C_a$ and $C_{ox}$. When this switch 56 is opened and the node 44 is floating, current flows through $C_a$ and $C_{ox}$ to store a voltage change representative of $-Q_{n-1}$ during the time that the charge is leaving the well under the electrode 42. When the charge $Q_n$ enters the well between times $t_2$ and $t_3$, current flows through $C_a$ and $C_{ox}$ to store a voltage change representative of $+Q_n$, thus providing the difference voltage on the lead 44. Small currents flowing through $C_d$ relative to currents through $C_a$ and $C_{ox}$ have been neglected for simplicity since $C_d$ is assumed much smaller than $C_a$. If $C_d$ and $C_{ox}$ are both much smaller than $C_a$, then $C_a \approx C_t$.

Figure 6:
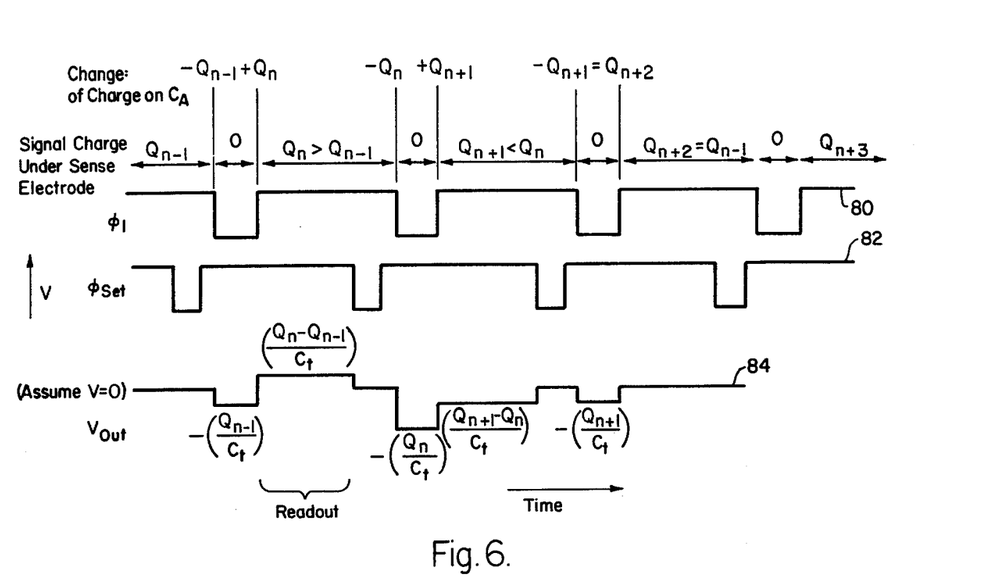
FIG. 6 is a schematic diagram of waveforms of voltage and locations of charge as a function of time for further explaining continuous subtraction of differencing in the system of FIG. 1.

Referring now to FIG. 6, the $\phi_1$ pulses of a waveform 80 are shown relative to the $\phi_{SET}$ pulses of a waveform 82 to provide a difference voltage $V_{out}$ as shown by a waveform 84. It can be seen that the $\phi_{SET}$ pulse always precedes the $\phi_1$ pulse and a difference voltage may be read after each $\phi_1$ pulse such as difference voltages $$\frac{Q_n - Q_{n-1}}{C_t} \text{ and } \frac{Q_{n+1} - Q_n}{C_t},$$

assuming that V which is substantially a bias voltage is at 0 volts. For V to be equal to 0 volts the substrate may be at +15 volts and the clock pulses vary from +10 volts to −10 volts. During the period of the pulses $\phi_1$ of the waveform 80, no charge is present under the electrode 42 since there is no potential minimum. Thus, it can be seen that, if desired, continous differences can be obtained of a sequence of signal charges, in accordance with the system of the invention.

Figure 7:
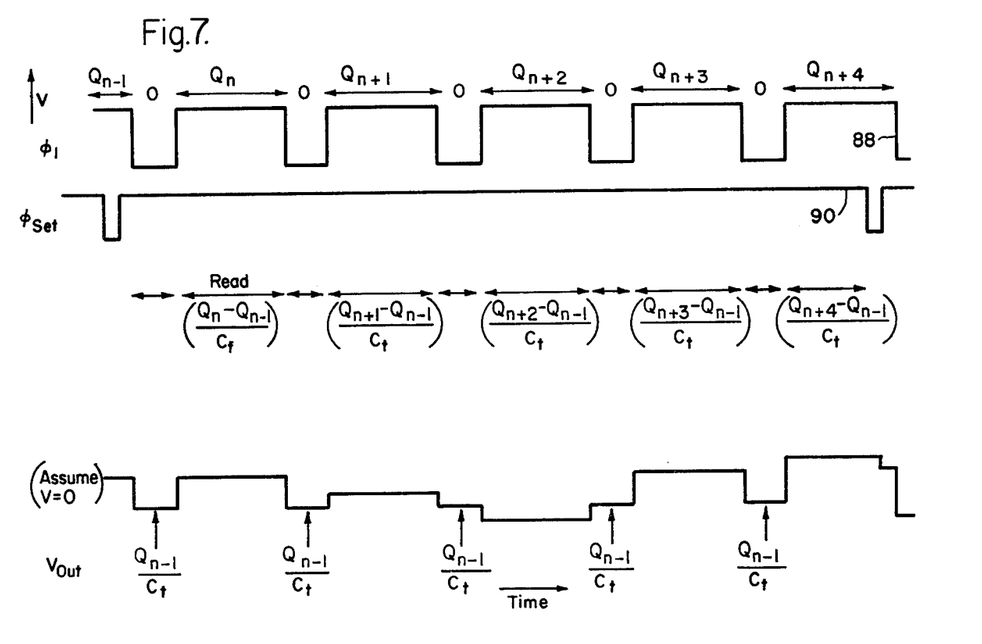
FIG. 7 is a schematic diagram of waveforms of voltage as a function of time for explaining the selective differencing in the system of FIG. 1.

Referring now to FIG. 7, a timing arrangement is shown in which a first charge is subtracted from a selected charge or selected charges along a sequence of charges passing along the channel. The $\phi_1$ pulses of a waveform 88 are shown with the voltage from the charge that is present under the electrode 42 being indicated and the $\phi_{SET}$ pulse of a waveform 90 is illustrated with a first pulse only occuring prior to the first $\phi_1$ pulse when the charge $Q_{n-1}$ is in the well under the electrode 42. The second $\phi_{SET}$ pulse of the waveform 90 occurs when the charge $Q_{n+4}$ is in the well under the electrode 42 to establish a new potential reference in the capacitance $C_t$. During each of the reading periods between the two $\phi_{SET}$ pulses, the charge on $C_t$ has the charge $Q_{n-1}$ subtracted therefrom with this operation continuing until the second $\phi_{SET}$ pulse of the waveform 90. Thus, any sample may be selected to be subtracted from a sequence of signal charges being propagated along the channel. It has been noted that reading occurs between the negative pulses of the waveform 88.

Figure 8:
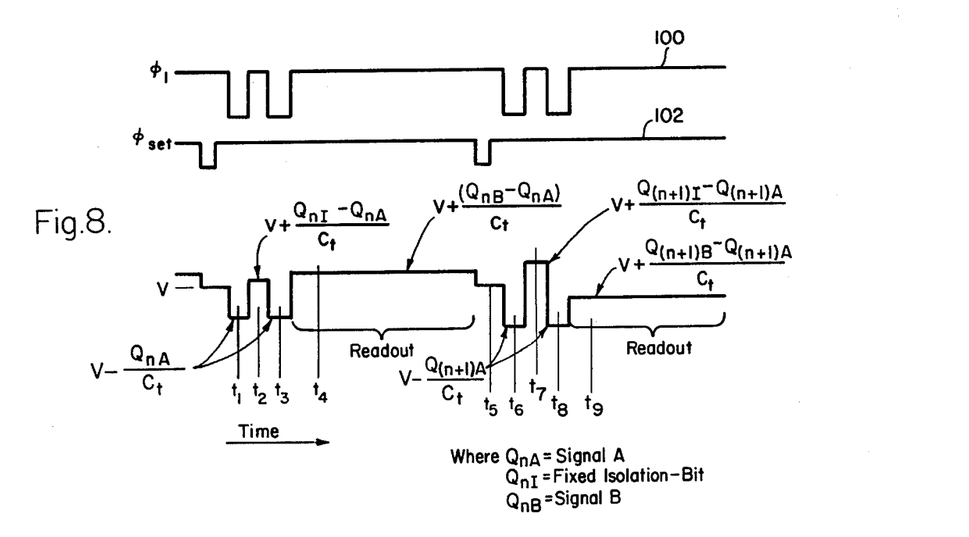
FIG. 8 is a schematic diagram of waveforms of voltage as a function of time for explaining the operation of the system of FIG. 1 in which an isolation bit is provided between signal charges.

Referring now to FIG. 8, an arrangement is shown in accordance with the invention where an isolation bit is provided between each subtraction operation so that for example when charges have been transferred through many cycles along the channel with some charge transfer inefficiency, the lost charge in the preceding sample substantially does not affect the difference value since lost charges appear in isolation bits. The isolation bit may be a fat zero. It will be understood that the principle of the invention also includes any desired number of isolation bits between the charges that are to be subtracted. The $\phi_1$ pulse of a waveform 100 has two pulses after each $\phi_{SET}$ pulse of a waveform 102 so that at times $t_1$ and $t_3$ the voltage under the electrode 42 is $$V - \frac{Q_{nA}}{C_t}.$$

At a time $t_2$ the voltage in the well is $$V + \frac{Q_{nI} - Q_{nA}}{C_t}$$

and at the time $t_4$ the voltage that may be read out is $$V + \frac{Q_{nB} - Q_{nA}}{C_t}.$$

$Q_{nA}$ is a signal A, $Q_{nI}$ is a fixed isolation bit which may be fat zero plus some transfer inefficiency charge and $Q_{nB}$ is a signal B. At a time $t_5$ the $\phi_{SET}$ pulse of the waveform 102 is applied, at time $t_6$ in response to the first pulse of the waveform 100 the voltage stored in the capacitance $C_t$ is $$V - \frac{Q_{(n+1)A}}{C_t}$$

and at time $t_7$ the voltage is $$V + \frac{Q_{(n+1)I} - Q_{(n+1)A}}{C_t}.$$

At time $t_8$ the pulse of the waveform 100 results in the voltage $$V - \frac{Q_{(n+1)A}}{C_t}$$

on the capacitance $C_{tQ}$. The readout available then at time $t_9$ is $$V + \frac{(Q_{(n+1)B} - Q_{(n+1)A})}{C_t}.$$

Thus the use of a single isolation bit allows greater subtraction accuracy and if further accuracy is required additional isolation bits may be utilized. The repetition rate of the $\phi_{SET}$ pulse of the waveform 102 is equal to the pulse repetition rate of $\phi_{SET}$ of the waveform 100 divided by (1 plus number of isolation bits).

Figure 9:
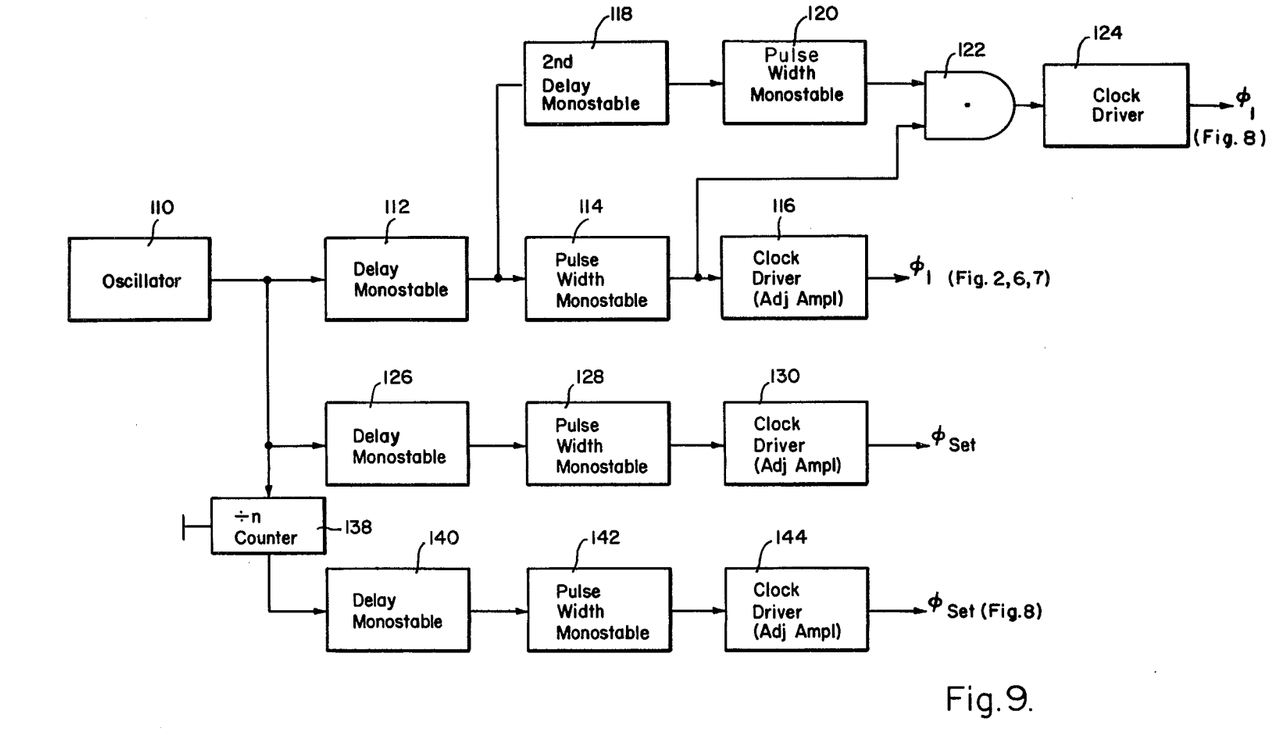
FIG. 9 is a schematic block diagram showing an illustrative arrangement for providing the $\phi_1$ and $\phi_{SET}$ pulses.

Referring now to FIG. 9 an example of pulse sources to provide the different subtractions is shown as an illustrative example. An oscillator 110 applies signals to a delay monostable circuit 112 which in turn applies signals to a pulse width monostable circuit 114. A clock driver 116 for providing amplitude adjustment responds to the circuit 114 to develop the $\phi_1$ pulses that may be utilized in the arrangements of FIGS. 2, 6 and 7. For the isolation arrangement of FIG. 8 a second delay monostable circuit 118 may be coupled to the output of the delay monostable circuit 112 and applies signals through a serial path of a monostable circuit 120, an AND gate 122 and a clock driver 124. The AND gate 122 also receives the signal from the pulse width monostable circuit 114. The $\phi_{SET}$ pulses for all the arrangements that utilize a continuous repetitive pulse (all except for FIG. 8) may be formed from a series path of delay monostable circuit 126, a pulse width monostable ciruit 128 and a clock driver 130, circuit 126 being coupled to the oscillator 110. The $\phi_{SET}$ pulse of FIG. 8 which occurs when a difference is desired may include a series path of a divide by n counter 138 being adjustable and responding to the oscillator 110, a delay monostable circuit 140, a pulse width monostable circuit 142 and a clock driver 144. It is to be understood that the arrangement of FIG. 9 is only an illustrative example, and any suitable arrangement for providing the pulses may be utilized all within the scope of the invention.

Figure 10:
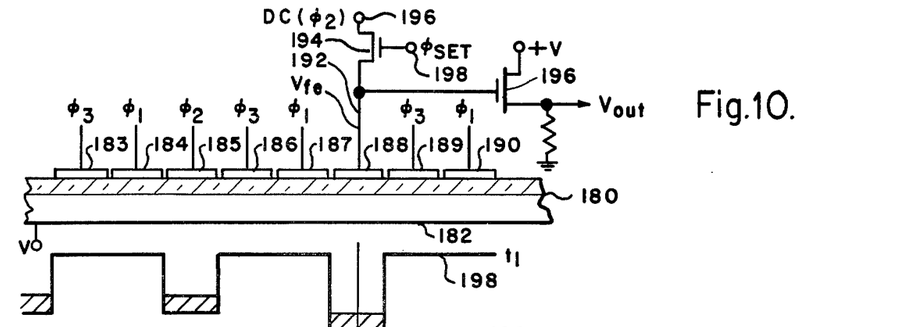
FIG. 10 is a schematic diagram showing charge subtraction in a three phase CCD structure.
Figure 10A:
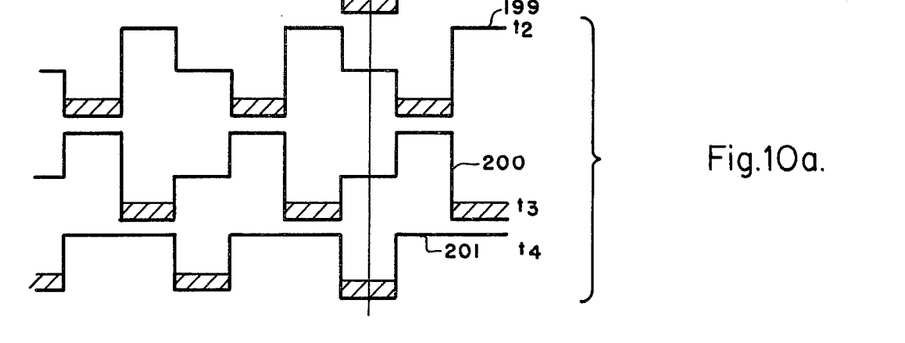
FIG. 10a is a schematic diagram showing the surface potential profile for three time conditions in the structure of FIG. 10.
Figure 11:
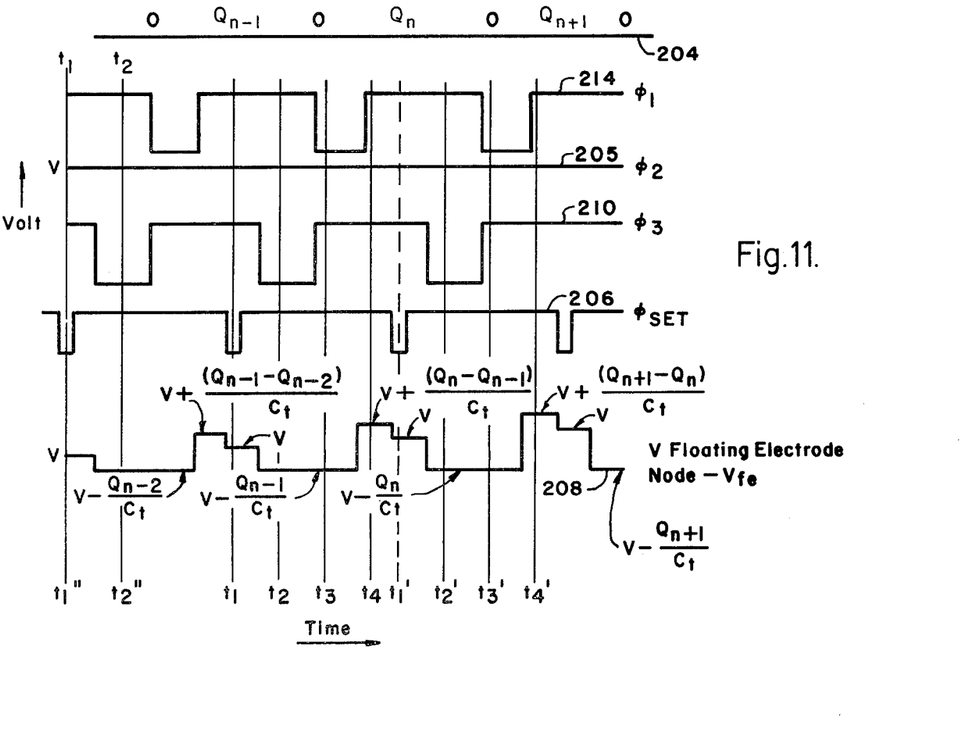
FIG. 11 is a schematic diagram of waveforms of voltage as a function of time for explaining the operation of the three phase arrangement of FIG. 10.

Referring now to FIGS. 10, 10a and 11 a three phase cancellation arrangement is shown for illustrating that the principles of the invention are equally applicable to any suitable CCD structure and to any number of phases, or to any combination of phase pulses and DC signals utilized for driving the charge packets and for CCD operation. Positioned on a substrate 180 having a plate 182 coupled to a suitable voltage source V, are electrodes 183 to 190 respectively, coupled to receive signals $\phi_3$, $\phi_1$, $\phi_2$, $\phi_3$, $\phi_1$, $DC(\phi_2)$, $\phi_3$ and $\phi_1$ from suitable sources. The electrode 180 which is the floating electrode is coupled to a lead 192 which in turn is coupled through a PET 194 to a $DC(\phi_2)$ source 196. The lead 192 is also coupled through a source follower 196 to provide an output signal $V_{OUT}$. In the illustrated arrangement the charge values are transferred along the channel and a difference signal is read at the electrode 188. As shown in FIG. 10a, at time $t_1$ which is reset time, the charge packets are under electrodes 184 and 188 as shown by a potential profile 198. At time $t_2$ in response to the $\phi_3$ pulse the charge packets are transferred to under electrodes 186 and 189 as shown by a potential profile 199. At time $t_3$ in response to the $\phi_1$ pulse the charge packets are transferred under electrodes 184, 189 and 190 as shown by a potential profile 200. At time $t_4$ the charge packets are transferred to under electrodes 185 and 188 as shown by a potential profile 201, so that the difference value can be read from the floating electrode 188. This operation continues in a similar and repetitive manner in response to the clock pulses.

As shown principally in FIG. 11, which shows the charge being transferred under floating electrode 188 by a line 204, at time $t_1$ in response to the $\phi_{SET}$ pulse of a waveform 206 the voltage V of a waveform 205 is stored on the floating electrode nodal capacitance as shown by a waveform 208. The 100 3 pulse of a waveform 210 establishes the well of the voltage profile at time $t_2$ and the $\phi_1$ pulse of a waveform 214 establishes the well of the voltage profile at time $t_3$. At time $t_3$ the charge on the floating electrode node is $$V - \frac{Q_{n-1}}{C_t}.$$

At time $t_4$ when the charge packet $Q_n$ is transferred to under the floating electrode 188 the floating electrode node voltage is $$V + \frac{Q_n - Q_{n-1}}{C_t}$$

which is the difference voltage as explained previously relative to the single phase operation. At time $t_1'$ in response to the $\phi_{SET}$ pulse of the waveform 206 the voltage V is again established on the floating electrode node, and the subsequent differencing operation continues in a similar manner to provide the next difference $$V + \frac{Q_{n+1} - Q_n}{C_t}$$

at time $t_4$. Thus the principles of the invention are applicable to other structures and driving arrangements such as the three phase structure of FIG. 10.

Thus, there has been provided a CCD signal subtraction system in which an electrode is clamped in the presence of a first charge and then when that charge leaves the potential well under the floating electrode and a second charge enters, the signal sensed is the difference signal with ideal common mode rejection. By clocking the reset clamp on selected CCD clock periods and observing on intermediate periods, a difference signal may be provided between selected charges. Also, for operation when charge transfer efficiency is a problem any number of isolation bits may be utilized by controlling the number of pulses of the $\phi_1$ signal relative to the $\phi_{SET}$ pulses. The principles of the invention may be utilized for example in the detection of minimum signal charge superimposed on a large background charge for determining moving targets or for MTI. The charge subtraction principles in accordance with the invention are not to be limited to any particular system or to any electrode structure or number of operating driving phases but may be utilized wherever a difference between two signals is required. The concepts of the invention are equally applicable to bucket brigade structures as to CCD structures.

What is claimed is:

1. In a charge transfer device formed in a semiconductive substrate having an electrical surface potential, a charge flow channel, a floating electrode overlying said channel, a sense well in said surface potential beneath said floating electrode and a set voltage source, a method for information signal subtraction, comprising:
   sensing a first external information signal corresponding to an arithmetic minuend;
   injecting a minuend signal charge packet representative of said minuend signal from said charge injector into said channel in response to said first sensing step;
   sensing a second external information signal representative of an arithmetic subtrahend;
   injecting a subtrahend signal charge packet representative of said subtrahend signal from said charge injector into said channel in response to said second sensing step;
   transferring said minuend charge packet into said sense well after said first injection step;
   temporarily connecting said set voltage source to said floating electrode and then disconnecting said set voltage source from said floating electrode after said first transferring step;
   removing said minuend signal charge packet out of said sense well after said disconnecting step;
   second transferring said subtrahend charge packet into said sense well after said removing step; and
   measuring the voltage potential of said floating electrode after said second transferring step, wherein said second sensing and injecting steps are performed after said first sensing and injecting steps and before said second transferring step.

2. In a charge transfer device formed in a semiconductive substrate having an electrical surface potential, a charge flow channel including a signal charge injector, a floating electrode overlying said channel, a sense well in said surface potential beneath said floating electrode and a set voltage source, a method for information signal subtraction, comprising:

introducing a minuend signal charge packet representative of a minuend information signal from said signal charge injector into said channel;
second introducing a second signal charge packet representative of a subtrahend information signal from said signal charge injector into said channel;
first transferring said minuend signal charge packet into said sense well after said first introducing step;
temporarily connecting and then disconnecting said floating electrode and said set voltage source after said first transferring step;
removing said minuend signal charge packet from said sense well after said disconnecting step;
second transferring said subtrahend signal charge packet into said sense well after said removing step; and
measuring the voltage potential of said floating electrode after said second transferring step, wherein said first transferring step is performed after said first introducing step and said second transferring step is performed after said second introducing step and after said removing step.

3. A charge transfer device subtractor formed on a semiconductive substrate having an electrical surface potential, a charge flow channel, a floating electrode overlying said channel, a sense well in said surface potential beneath said floating electrode and a set voltage source, comprising:
means for sensing first and second external information signals corresponding to an arithmetic minuend and subtrahend, respectively;
means responsive to said sensing means for injecting a minuend signal charge packet representative of said first signal into said sense well;
means for temporarily connecting and then disconnecting said set voltage source and said floating electrode while said minuend signal charge packet is in said sense well;
said injecting means comprising means responsive upon said disconnecting of said set voltage source for removing said minuend charge packet from said sense well and for injecting a subtrahend charge packet representative of said subtrahend signal into said sense well; and
means responsive upon said injecting of said subtrahend charge packet into said sense well for sensing the potential of said floating electrode.

4. A charge transfer device subtractor formed on a semiconductive substrate having an electrical surface potential, a charge flow channel, a floating electrode overlying said channel, a sense well in said surface potential beneath said floating electrode and a set voltage source, comprising:
means for injecting a minuend charge packet and a subtrahend charge packet into said channel, said minuend and subtrahend charge packets being representative of minuend and subtrahend external information signals respectively which are to be subtracted from one another;
means responsive to said injecting of said minuend charge packet for transferring said minuend charge packet into said sense well, temporarily connecting and disconnecting said floating gate and said set voltage source and removing said minuend charge packet from said sense well; and
said transferring means comprising means responsive to said removing of said minuend charge packet for transferring said subtrahend charge packet into said sense well and for sensing the potential of said floating gate.

5. A charge transfer device subtractor formed on a semiconductive substrate having an electrical surface potential, a charge flow channel, a floating electrode overlying said channel, a sense well in said surface potential beneath said floating electrode and a set voltage source, comprising:
means for sensing a minuend signal and a subtrahend signal which are to be subtracted from one another and for transferring a minuend charge packet representative of said minuend signal into said sense well, removing said minuend charge packet from said sense well and transferring a subtrahend charge packet representative of said subtrahend signal into said sense well;
means operating whenever said minuend charge packet is in said sense well for temporarily connecting and disconnecting said floating gate and said set voltage source; and
means operating whenever said subtrahend charge packet is in said sense well for measuring the potential of said floating electrode.

6. The charge transfer device subtractor of claim 3 wherein said sensing means comprise an input diffusion connected to sense said minuend and subtrahend external signals and disposed at one end of said channel.

7. The charge transfer device subtractor of claim 6 wherein said injecting means comprise a gate electrode overlying said substrate adjacent said input diffusion and connecting to receive a first clock signal.

8. The charge transfer device subtractor of claims 3, 4 or 5 wherein said connecting and disconnecting means comprise a switch connected between said set voltage source and said floating electrode, said switch operated in synchronism with a reset clock signal.

9. The charge transfer device subtractor of claim 7 wherein said injecting means comprise an input diffusion in said substrate disposed at one end of said channel, a gate electrode overlying said substrate adjacent said input diffusion, said gate electrode connected to receive a clock signal.

10. The charge transfer device subtractor of claim 4 wherein said transferring means comprise a plurality of mutually overlapping electrodes overlying said substrate and insulated therefrom, said plurality of electrodes being adjacent said floating electrode and said injecting means, and means connecting alternate ones of said plurality of electrodes to a clock signal.

11. The charge transfer device subtractor of claim 5 in which said sensing, transferring and removing means comprise an input diffusion disposed in said substrate at one end of said channel, a plurality of mutually overlapping electrodes overlying said substrate and disposed in serial fashion along the length of said channel, said floating electrode included within said plurality of insulated electrodes, at least alternate ones of said plurality of electrodes being connected to receive a clock signal.

* * * * *